United States Patent
Cohen

(10) Patent No.: US 10,601,125 B2
(45) Date of Patent: Mar. 24, 2020

(54) ELECTRICALLY SHORT ANTENNAS WITH ENHANCED RADIATION RESISTANCE

(71) Applicant: GEORGIA TECH RESEARCH CORPORATION, Atlanta, GA (US)

(72) Inventor: Morris Cohen, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 454 days.

(21) Appl. No.: 15/327,295

(22) PCT Filed: Jul. 23, 2015

(86) PCT No.: PCT/US2015/041724
§ 371 (c)(1),
(2) Date: Jan. 18, 2017

(87) PCT Pub. No.: WO2016/014790
PCT Pub. Date: Jan. 28, 2016

(65) Prior Publication Data
US 2017/0179587 A1  Jun. 22, 2017

Related U.S. Application Data

(60) Provisional application No. 62/027,834, filed on Jul. 23, 2014.

(51) Int. Cl.
*H01Q 1/36* (2006.01)
*H01Q 9/00* (2006.01)
(Continued)

(52) U.S. Cl.
CPC ............ *H01Q 1/366* (2013.01); *H01Q 9/005* (2013.01); *H01J 37/32082* (2013.01);
(Continued)

(58) Field of Classification Search
CPC ............... H01J 37/3222; H01J 37/321; H01J 37/32229; H01J 37/32174; H01L 21/3065;
(Continued)

(56) References Cited

U.S. PATENT DOCUMENTS 5,963,169 A * 10/1999 Anderson ............... H01Q 1/26
343/701
6,169,520 B1 * 1/2001 Anderson ............... H01Q 1/26
343/701
(Continued)

FOREIGN PATENT DOCUMENTS

WO  WO-0021156 A1 *  4/2000  ............... H01Q 1/26

OTHER PUBLICATIONS

PCT Patent Application PCT/US2015/041724, filed on Jul. 23, 2015, International Search Report and Written Opinion dated Oct. 15, 2015.
(Continued)

*Primary Examiner* — Olumide Ajibade Akonai
(74) *Attorney, Agent, or Firm* — Thomas Horstemeyer, LLP

(57) ABSTRACT

Various methods, apparatus, devices and systems are provided for electrically short antennas for efficient broadband transmission. In one example, among others, a system includes a segmentally time-variant antenna and a segment controller that can control conductivity of individual segments of the segmentally time-variant antenna. The conductivity of the individual segments is modulated to allow a pulse to propagate from the proximal end to the distal end of the segmentally time-variant antenna and impede a reflection of the pulse from propagating back to the proximal end of the segmentally time-variant antenna. In another embodiment, a method includes injecting a pulse at a first end of a
(Continued)

segmentally time-variant antenna and modulating conductivity of individual segments to allow the pulse to propagate to a second end of the segmentally time-variant antenna and impede a reflection of the pulse from propagating back to the first end.

19 Claims, 7 Drawing Sheets

(51) Int. Cl.
*H05H 1/46* (2006.01)
*H01Q 1/26* (2006.01)
*H01Q 13/28* (2006.01)
*H01J 37/32* (2006.01)

(52) U.S. Cl.
CPC .............. *H01Q 1/26* (2013.01); *H01Q 1/364* (2013.01); *H01Q 13/28* (2013.01); *H05H 2001/463* (2013.01); *H05H 2001/4652* (2013.01)

(58) Field of Classification Search
CPC ..... H05H 2001/463; H05H 2001/4622; H01Q 1/366; H01Q 1/26; H01Q 1/38; H01Q 15/08; H01Q 19/32; H01Q 13/28; H01Q 15/14; H01Q 1/22; H01Q 1/36; H01Q 1/364; H01Q 9/005
USPC ......................................................... 343/701
See application file for complete search history.

(56) References Cited

U.S. PATENT DOCUMENTS

| | | | | |
|---|---|---|---|---|
| 6,770,852 | B1* | 8/2004 | Steger | F27B 5/14 |
| | | | | 118/50.1 |
| 7,274,333 | B1* | 9/2007 | Alexeff | H01Q 1/366 |
| | | | | 343/701 |
| 7,719,471 | B1* | 5/2010 | Pavliscak | H01Q 1/26 |
| | | | | 343/701 |
| 7,999,747 | B1* | 8/2011 | Wedding | H01Q 1/366 |
| | | | | 343/701 |
| 8,384,602 | B2* | 2/2013 | Anderson | H01Q 1/26 |
| | | | | 343/701 |
| 9,705,538 | B2 | 7/2017 | Suh et al. | |
| 9,705,714 | B2 | 7/2017 | Manteghi et al. | |
| 2004/0130491 | A1 | 7/2004 | Hayes | |
| 2004/0130497 | A1 | 7/2004 | Alexeff et al. | |
| 2006/0022877 | A1* | 2/2006 | Goldberg | H01Q 1/241 |
| | | | | 343/701 |
| 2006/0220980 | A1 | 10/2006 | Metz | |
| 2008/0266199 | A1 | 10/2008 | Milosavljevic et al. | |
| 2009/0015489 | A1* | 1/2009 | Marquis | H05H 1/46 |
| | | | | 343/701 |
| 2013/0134576 | A1* | 5/2013 | Hayashi | H01L 21/02697 |
| | | | | 257/734 |
| 2014/0148637 | A1* | 5/2014 | Gratt | A61N 1/08 |
| | | | | 600/9 |
| 2014/0333485 | A1* | 11/2014 | Stone | H01Q 1/366 |
| | | | | 343/701 |

OTHER PUBLICATIONS

Chu, L. J. "Physical Limitations of Omni-Directional Antennas". Journal of Applied Physics. (Dec. 1948) 19, 1163-1175. DOI: 10.1063/1.1715038.
Harrington, R. F., "Effect of Antenna Size on Gain, Bandwidth, and Efficiency". Journal of Research of National Bureau of Standards. (Jan.-Feb. 1960) 64D(1) 1-12.
Fenwick, R. C., "A New Class of Electrically Small Antennas". IEEE Transactions on Antennas and Propagation. (May 1965) AP-8, 379-383.
Wheeler, H. A., "Small Antennas". IEEE Transactions on Antennas and Propagation. (Jul. 1975) AP-23(4), 462-469.
Field, Jr., et al., "An Aerostat-Supported ELF/VLF transmitter". Radio Science. (Mar.-Apr. 1989) 24(2), 235-246.
McLean, J. S., "A Re-Examination of the Fundamental Limits on the Radiation Q of Electrically Small Antennas". IEEE Transactions on Antennas and Propagation. (May 1996) 44(5), 672-676.
Jenn, D. C., "Plasma Antennas: Survey of Techniques and the Current State of the Art". Naval Postgraduate School. (Sep. 2003) 1-27.
Schwartz, D. F. and Allen, J. C., "Wide-Band Impedance Matching: H∞ Performance Bounds". IEEE Transactions on Circuits and Systems-II: Express Briefs. (Jul. 2004) 51(7) 364-368.
Ziolkowski, R. W. and Erentok, A., "Metamaterial-Based Efficient Electrically Small Antennas". IEE Transactions on Antennas and Propagation. (Jul. 2006) 54(7) 2113-2130.
Ziolkowski, R. W. and Erentok, A., "At and below the Chu Limit: Passive and Active Broad Bandwidth Metamaterial-Based Electrically Small Antennas". IET Microw Antennas Propagation. (Feb. 2007) 1(1) 116-128.
Alexeff, et al.,"Recent Results for Plasma Antennas". Physics of Plasmas. (May 2008) 15(057104) 1-4. DOI: 10.1063/1.2919157.
Allen, J. C., Arceo, D., and Hansen, P., "Optimal Lossy Matching by Pareto Fronts". IEE Transactions on Circuits and Systems—II: Express Briefs. (Jun. 2008) 55(6) 497-501.
Ziolkowski, R.,"Efficient Electrically Small Antenna Facilitated by a Near-Field Resonant Parasitic". IEEE Antennas and Wireless Propagation Letters. (May 2008) 7, 580-583.
Sussman-Fort, S. E. and Rudish, R. M., "Non-Foster Impedance Matching of Electrically-Small Antennas". IEEE Transactions on Antennas and Propagation. (Aug. 2009) 57(8) 2230-2241.
Stearns, S. D., "Non-Foster Circuits and Stability Theory". 2011 IEEE International Symposium on Antennas and Propagation (APSURSI), Spokane, WA,. (Jul. 2011) 1942-1945.
Azad, U. and Wang, Y. E., "Direct Antenna Modulation (DAM) for Enhanced Capacity Performance of Near-Field Communication (NFC) Link". IEEE Transactions on Circuits and Systems—I: Regular Papers. (Mar. 2014) 61(3) 902-910.
Yao, W. and Wang, Y., "Direct Antenna Modulation—A Promise for Ultra-Wideband (UWB) Transmitting". 2004 IEEE MTT-S International Microwave Symposium Digest (Jun. 2004) 2, 1273-1276.

* cited by examiner

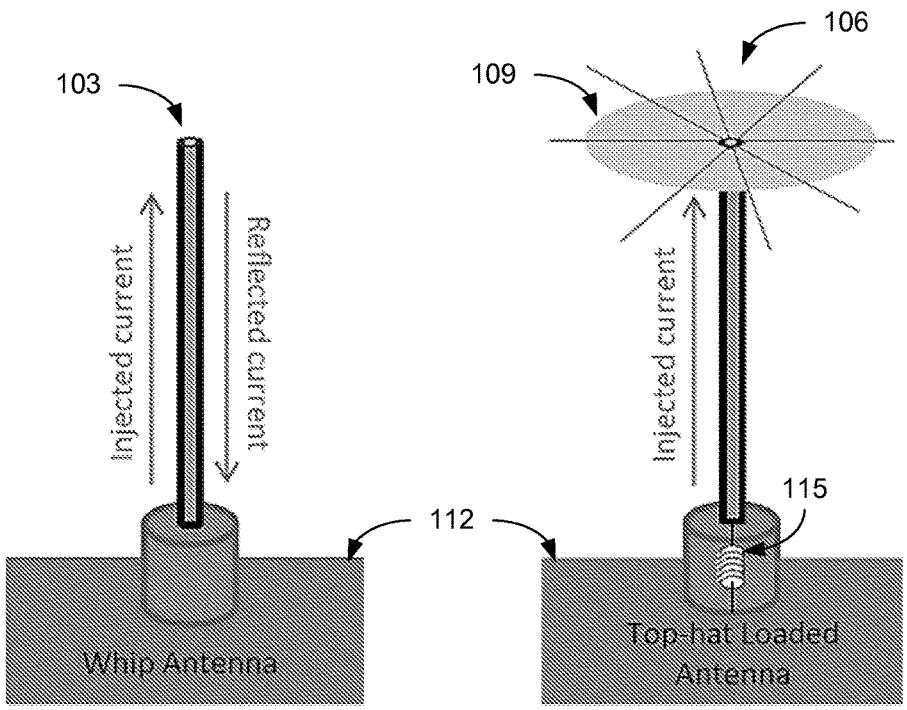
FIG. 1A  FIG. 1B
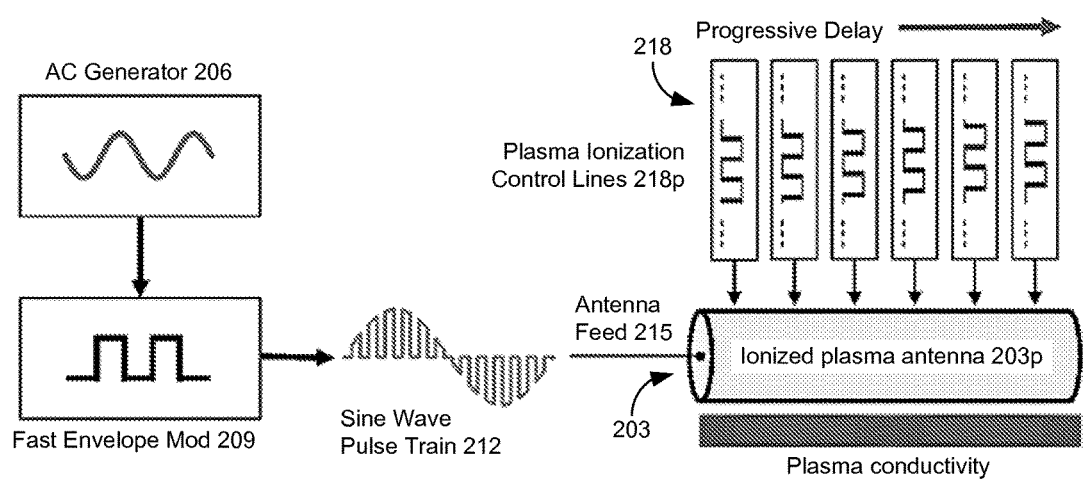
FIG. 2

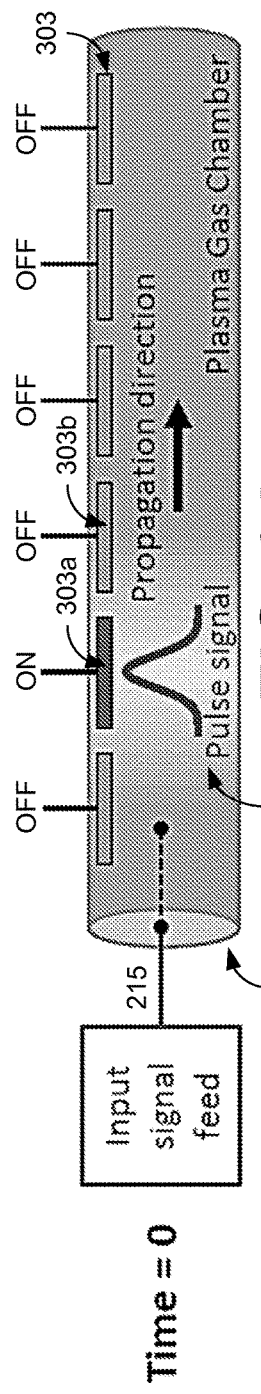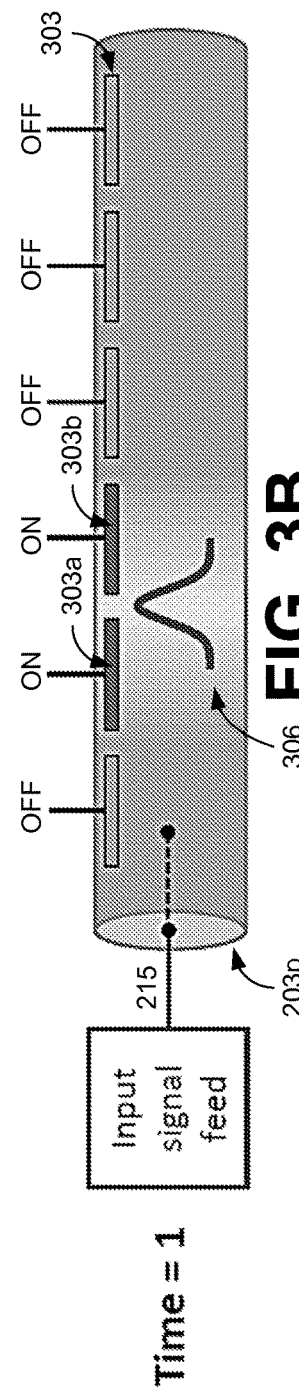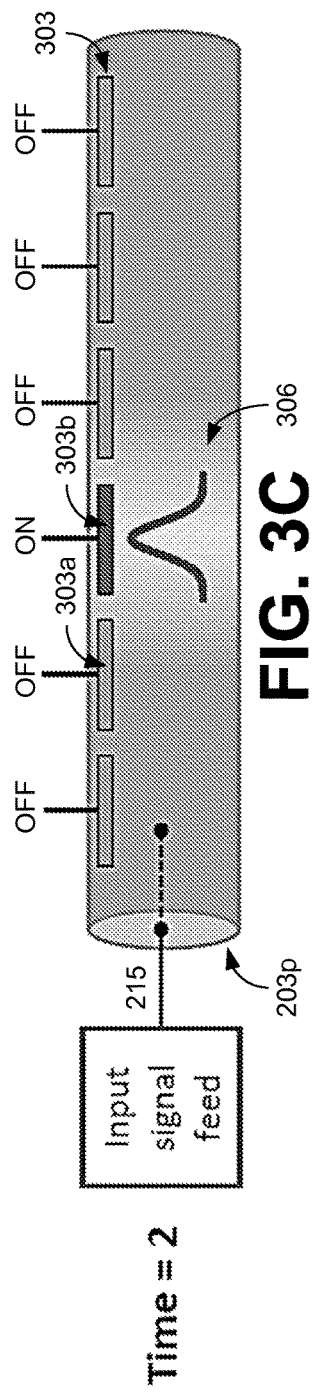

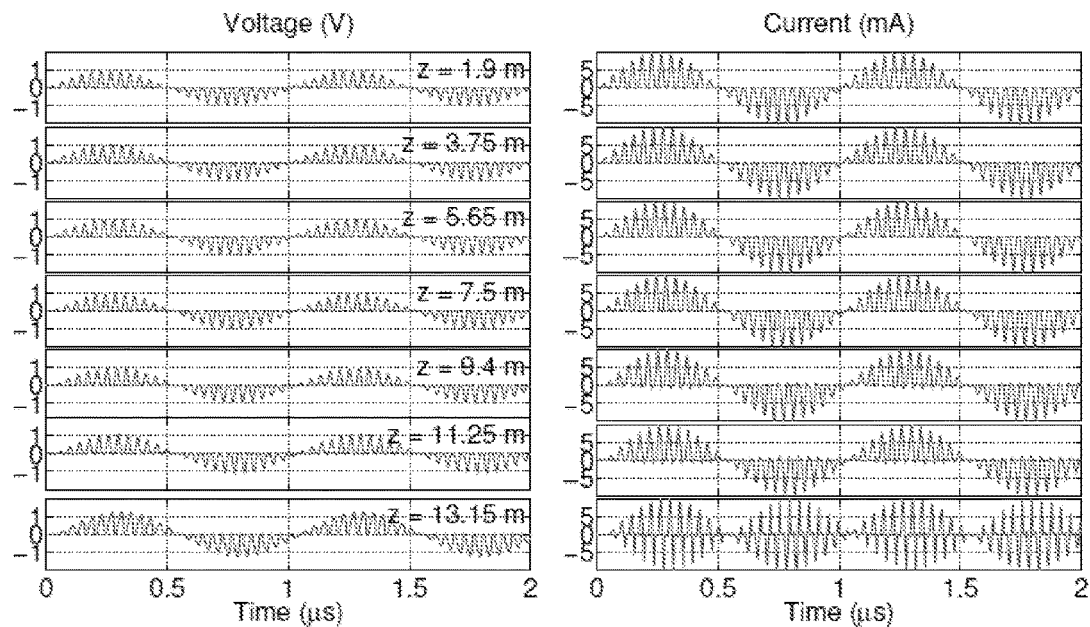
FIG. 7A FIG. 7B
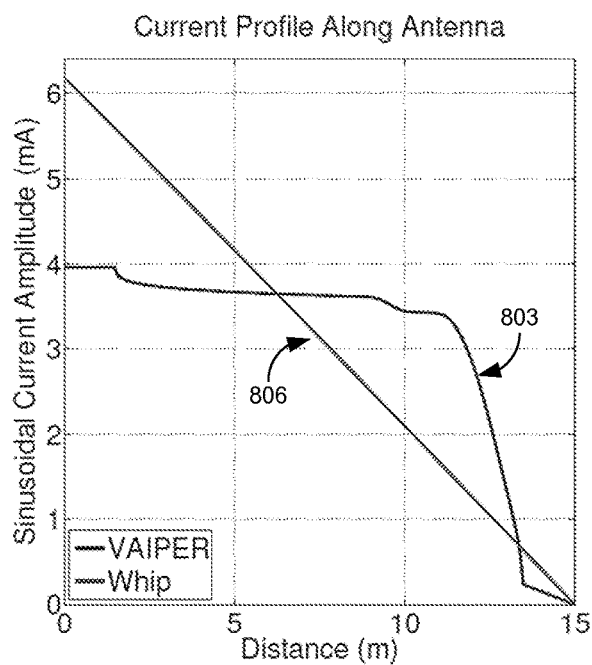
FIG. 8

ELECTRICALLY SHORT ANTENNAS WITH ENHANCED RADIATION RESISTANCE

CROSS REFERENCE TO RELATED APPLICATIONS

This application is the 35 U.S.C. § 371 national stage application of PCT Application No. PCT/US2015/041724, filed on Jul. 23, 2015, which claims priority to, and the benefit of, U.S. provisional application entitled "Efficient Broadband Electrically Short Plasma Transmitting Antennas" having Ser. No. 62/027,834, filed Jul. 23, 2014, which is hereby incorporated by reference in its entirety.

BACKGROUND

Very Low Frequency (VLF, 3-30 kHz) waves have long been used for global submarine communications and navigation. Although lightning is a frequent and intense source of VLF waves, anthropogenic generation of broadband VLF waves remains difficult because of the extremely long wavelengths (10-100 km). Development of global VLF-based navigation systems, as well as underground remote sensing with VLF waves that penetrate into the ground, is hampered by the inability to generate broadband VLF waves.

SUMMARY

Embodiments of the present disclosure are related to electrically short antennas for efficient broadband transmission. In one or more aspects, conductivity of individual segments of a segmentally time-variant antenna can be controlled to allow a pulse to propagate from a first end to a second end of the segmentally time-variant antenna and impede a reflection of the pulse from propagating back to the first end. The conductivity of the individual segments can be modulated at speeds comparable to or faster than the propagation delays of voltage pulses across the antenna.

In an embodiment, a system is provided that comprises a segmentally time-variant antenna including a plurality of segments between a proximal end and a distal end of the segmentally time-variant antenna; and a segment controller configured to control conductivity of individual segments of the plurality of segments. The conductivity of the individual segments can be modulated by the segment controller to allow a pulse to propagate from the proximal end to the distal end of the segmentally time-variant antenna and impede a reflection of the pulse from the distal end of the segmentally time-variant antenna from propagating back to the proximal end of the segmentally time-variant antenna. In some aspects, the segmentally time-variant antenna can be an ionized plasma antenna. The ionized plasma antenna can comprise electrodes corresponding to the individual segments of the plurality of segments, the electrodes energized and de-energized by the segment controller to modulate the conductivity of plasma in the individual segments. The plurality of electrodes can be sequentially energized based at least in part upon the propagation time of the pulse through the segmentally time-variant antenna and spacing between the plurality of segments.

In one or more aspects, the ionized plasma antenna can comprise a plasma chamber extending from the proximal end to the distal end of the ionized plasma antenna; and a series of electrode pairs positioned along the axial length of the plasma chamber, where individual electrode pairs of the series of electrode pairs are associated with a corresponding segment of the plurality of segments. The segment controller can comprise plasma ionization control lines coupled to individual electrode pairs of the series of electrode pairs. The pulse can be supplied to the segmentally time-variant antenna via a feed connection at the proximal end of the segmentally time-variant antenna.

In one or more aspects, the conductivity of the individual segments can be modulated by the segment controller to allow a series of pulses to propagate from the proximal end to the distal end of the segmentally time-variant antenna and impede reflections of the series of pulses from the distal end of the segmentally time-variant antenna from propagating back to the proximal end of the segmentally time-variant antenna. The series of pulses can comprise a series of Gaussian pulses having amplitudes based upon envelope modulation with a communications signal. The system can comprise an envelope modulator configured to generate a series of pulses including the pulse, the series of pulses based upon a communication signal. The segmentally time-variant antenna can comprise a solid state semiconductor channel; and a plurality of electrodes disposed distributed along the solid state semiconductor channel, wherein the conductivity of the individual segments of the solid state semiconductor channel is modulated by energizing and de-energizing corresponding electrodes of the plurality of electrodes.

In an embodiment, a method is provided that comprises injecting a pulse at a proximal end of a segmentally time-variant antenna; and modulating conductivity of individual segments of the segmentally time-variant antenna to allow the pulse to propagate from the proximal end to a distal end of the segmentally time-variant antenna and impede a reflection of the pulse from the distal end of the segmentally time-variant antenna from propagating back to the proximal end of the segmentally time-variant antenna. In some aspects, the method can comprise injecting a series of pulses including the pulse; and modulating the conductivity of the individual segments of the segmentally time-variant antenna to allow the series of pulses to propagate from the proximal end to the distal end and impede reflections of the series of pulses from propagating back to the proximal end of the segmentally time-variant antenna. The method can comprise generating the series of pulses based at least in part upon a communication signal. The series of pulses can be generated by envelope modulating a square wave function with the communication signal.

In one or more aspects, a modulation delay between adjacent segments of the segmentally time-variant antenna can be based at least in part upon a propagation velocity of the pulse through the segmentally time-variant antenna and spacing between the adjacent segments. Modulation of the conductivity can comprise ionization of plasma of the segmentally time-variant antenna. Modulation of the conductivity of the individual segments can be progressively delayed from the proximal end to the distal end of the segmentally time-variant antenna. The delay between adjacent segments can be a fixed delay.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A and 1B are graphical representations of a whip antenna and top-hat loaded antenna.

FIG. 2 is a schematic diagram illustrating an example of a segmentally time-variant antenna in accordance with various embodiments of the present disclosure.

FIGS. 3A through 3C are graphical representations illustrating an example of the propagation of a pulse through the segmentally time-variant antenna of FIG. 2 in accordance with various embodiments of the present disclosure.

FIGS. 7A and 7B graphically illustrate the voltage and current produced by sinusoidally varying pulses, at different locations along the length of the segmentally time-variant antenna of FIG. 2, in accordance with various embodiments of the present disclosure.

FIG. 8 graphically illustrates a current profile of a sinusoidal communication signal along the segmentally time-variant antenna of FIG. 2 in accordance with various embodiments of the present disclosure.

DETAILED DESCRIPTION

Figure 4:
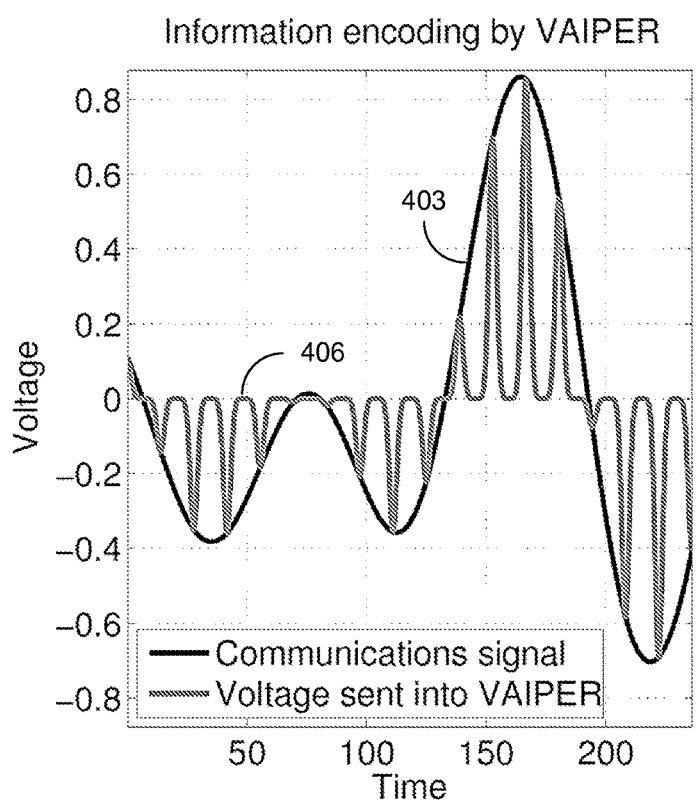
FIG. 4 illustrates an example of encoding a communication signal into a series of Gaussian pulses for transmission by the segmentally time-variant antenna of FIG. 2 in accordance with various embodiments of the present disclosure.

Disclosed herein are various embodiments related to electrically short antennas for efficient broadband transmission. Reference will now be made in detail to the description of the embodiments as illustrated in the drawings, wherein like reference numbers indicate like parts throughout the several views.

Generation of radio waves with electrically short antennas, where the antenna is much shorter than a wavelength, is a long-running challenge. The fundamental reason electrically short antennas are limited is that an injected voltage propagates down the antenna, reflects at the end, and returns to the feed in a time much shorter than a period in time. In that short echo time, the current being injected at the feed has barely changed, and so the reflected current almost entirely and immediately squelches the injected current. Consequently, electric charge is not delivered down the antenna effectively, and the radiation resistance is extremely small. Efficient radiation is currently possible only in a narrow frequency range, using electrical matching schemes that cancel out the high antenna impedance, but only at one frequency. Achievement of reasonable efficiency involves resonant tuning of a vertical antenna to match the antenna impedance, which does absorb the reflected wave. However, this still utilizes fairly long antennas (100 m or longer for 10-30 kHz antennas) and only works at a narrow frequency band of about 200 Hz or less. Metamaterial matching presents similar limitations with bandwidth.

This restriction can be overcome by allowing the current wave to propagate down the antenna, but blocking the reflected wave. For example, this can be implemented by creating an antenna with high-voltage ionized plasma as the conducting path. The plasma antenna comprises a series of segments that are each individually controllable. By strategically modulating the plasma conductivity in each segment, the flow of current, and therefore charge, can be controlled to the ends of the antenna. While this disclosure describes the use for Very Low Frequency (VLF) antennas, the idea is equally applicable to other applications that use electrically short antennas, like HF communications, or antennas on an integrated circuit, or RFID systems.

A practically realizable vertical antenna will invariably be much shorter than a wavelength. The radiation resistance (in $\Omega$) of a monopole antenna above a ground plane with length d, transmitting at frequency f is given as:

$$R_s = 40(\pi df)^2 \qquad (1)$$

Hence, the radiation resistance can become astonishingly small as the frequency decreases. For instance, for a 100 meter antenna at 20 kHz, $R_s$=0.0175. In order to transmit efficiently, the driving electronics must have total resistance below $R_s$. This is possible with resonant matching and tuning of the driving circuit, which results in a small frequency band about the tuned frequency. For instance, the US Navy transmitter in Cutler, Me. (known as NAA) transmits 1 MW of power at 24 kHz, but is limited to a 200 Hz bandwidth. Utilizing magnetic loop antennas is also impractical because the radiation resistance drops off as $1/r^3$, and so is even less efficient at radiating low frequency power. At best, gaming the matching network can allow for power to be injected into the induction field over a broader range of frequencies, but this does not result in more radiation field.

Below about 8 kHz, $R_s$ is so small that even resonant tuning fails to achieve reasonable efficiency. As such, horizontal antennas are sometimes used, which can be made much longer than a vertical antenna by stringing along support towers above the ground. But a horizontal antenna suffers from an image current, just below the conducting ground, which acts to cancel out the antenna current. This severely hurts the efficiency. For instance, a 150 km antenna was constructed in Wisconsin and North Dakota, but was able radiate only about 10 W at 76 Hz. The only successful horizontal antenna has been the Siple Station antenna in Antarctica, which benefited from a 2 km thick sheet of ice that lifted the antenna far off the ground. These limits have defined VLF transmitters for decades.

Antenna design commonly involves choosing one of a standard set of available antenna types for a given application, and then tuning the chosen antenna to fit a particular goal. In some cases, adaptable antennas may be used. An adaptive antenna can be reconfigured to one of multiple possible shapes, and then allowed to settle out to steady state conditions after reconfiguration for transmission. The same theory used to analyze how a fixed antenna design will perform can then be applied to the reconfigured adaptive antenna.

Recall that the fundamental formula for time-averaged radiated power from an electrically short dipole in air with a uniform current I over length d at a frequency f is:

$$P_{rad} = \frac{2(Id)^2 \eta \pi f^2}{3c^2} \quad (2)$$

where η is the impedance of the material (about 377Ω for air), c is the speed of light, and f is the frequency. Note that the radiated power is proportional to $f^2$. So the smaller an antenna is compared to the transmission wavelength, the less power is available to broadcast. For very short antennas, there is an additional impediment from matching that makes the actual frequency dependence $f^4$, due to the additional dependence of $f^4$ as shown in equation (1).

To understand this, consider the short monopole whip antenna 103 in FIG. 1A as a transmission line with length d and characteristic impedance $Z_0$. The distal end of the whip antenna 103 is an open circuit, so any voltage pulse sent down the whip antenna 103 reflects with a coefficient of +1 for voltage and −1 for current. So if a 1 Volt sinusoid is fed into the proximal feed end of the whip antenna 103, the voltage and current along the transmission line can be written as:

$$V(z, t) = \cos(\omega t - \beta z) + \cos(\omega t + \beta z), \quad (3)$$

$$I(z, t) = \frac{\cos(\omega t - \beta z)}{Z_0} - \frac{\cos(\omega t + \beta z)}{Z_0}, \quad (4)$$

where ω=2ηf is the wave frequency, $\beta = \omega/v_p$ is the wave number, and $v_p$ is the propagation velocity. In equations (3) and (4), the first term represents the forward-going wave ($V_{in}$) and the second term represents the reflected backward-going wave ($V_{out}$). For the current, the two terms very nearly cancel out when d is much smaller than a wavelength (which means βd≪1). As a result, the input impedance of the transmission line can be written by converting to phasor form, combining the input and reflected currents, and setting z=d, which gives:

$$Z_{in} = \frac{V}{I} = \frac{V_{in} + V_{out}}{I_{in} + I_{out}} = -jZ_0 \cot(\beta d). \quad (5)$$

When βd≪1, cot(βd) can be approximated by $$\frac{1}{\beta d}.$$

decreases, β increases, and the magnitude of the input impedance increases. So the same voltage produces a diminishing current as the frequency is decreased. Putting this 1/f dependence of the current on frequency into the formula for power radiated (equation (2)), the radiated power is proportional to $f^4$, meaning that halving the frequency decreases the power by a factor of 16. Alternatively, it takes 16 times more voltage at the feed end to produce the same current, and thus the same radiated power, when the frequency is simply halved.

The change from the $f^2$ relationship in equation (2) to the $f^4$ relationship results from the very high capacitance of the short antenna. One way around this problem is to employ a top-hat-loaded antenna 106, as Illustrated in FIG. 1B. Top-hat loading uses long wires or metal structures 109 at the distal end of the antenna 106 to build up a capacitance between the distal end of the antenna 106 and ground 112. The reduced impedance is then sufficiently small that it can then be canceled out with an inductor 115, usually near the base (proximal feed end) of the antenna 106. This is a common strategy in large AM radio towers, for instance, and is also heavily employed in Very Low Frequency antennas for submarine communications which operate at frequencies where the wavelengths are many km long. Unfortunately, because the antenna input impedance changes rapidly with frequency, top-hat-loading is a narrowband solution, allowing efficient operation only in a small frequency range.

On the other hand, if the electrical properties of an antenna can be varied faster than the propagation delay times across the antenna, standard antenna limitations can be broken. By blocking the reflection in the time domain, then high efficiency and small size can be achieved without sacrificing bandwidth. This can be achieved by creating an antenna with a series of segments whose conductivities are individually controllable, allowing for dynamic control of where current can propagate. Consider an analogy of traffic lights on a street. If the traffic lights are timed properly, cars traveling in one direction encounter only green lights, whereas traffic in the other direction encounters many red lights. Controlling the conductivity of individual segments of the antenna can achieve a similar effect, because each segment acts like a traffic light. In this way, the $f^4$ reduction of power with decreasing frequency can be converted back into the $f^2$ relationship, where the fundamental physics of equation (2) says it should be. In addition, because suppression of the reflections is in the time domain, it can in principle work at any frequency, unlike top-hat loading.

Referring to FIG. 2, shown is a schematic diagram illustrating an example of a very-short transmission antenna 203 having segments that can be dynamically varied to suppress the traveling wave reflections in the antenna 203. For transmission, a sinusoidal wave can be generated by an alternating current (AC) generator 206, and then converted with a fast envelope modulator 209, which divides the sinusoidal wave into a series of short pulses (or a sine wave pulse train) 212. The pulse train 212 can then be injected into a proximal end of the segmentally time-variant antenna 203 via an antenna feed 215. A segment controller 218 can be used to control the conductivity of individual segments of the antenna 203.

While the segmentally time-variant antenna 203 may be implemented in a variety of ways, the example of FIG. 2 utilizes an ionized plasma antenna 203p with the individual segments being controlled by corresponding plasma ionization control lines 218p. The ionized plasma antenna 203p comprises a plasma chamber extending the length of the antenna that contains an ionized gas as the plasma. The plasma is electrically conducting and thus can act as an antenna just like a metal. An advantage of plasma is that the conductivity of individual segments of the plasma can be controlled.

Consider a very-short antenna via ionized plasmas for efficient radiation (VAIPER) such as the ionized plasma antenna 203p of FIG. 2, where the conductivity of the plasma is controlled by a series of electrodes spaced along the long channel length of the plasma chamber which ionize the gas. The plasma is kept ionized by applying voltages across it as a function of the length along the plasma. The electrodes can be individually controlled to ionize the gas, and thus control the conductivity of the corresponding segment of the ionized plasma antenna 203p. The plasma ionization control lines 218p can be controlled to dynamically turn on and turn of different portion of the ionized plasma antenna 203p during transmission.

Modulating the plasma conductivity in each segment controls the flow of current, and therefore charge, to the end of the ionized plasma antenna 203p. The same voltage wave that modulates the generated sine wave can also be injected at the various points along the ionized plasma antenna 203p, with a progressive delay time to match the propagation velocity down the length of the plasma channel, allowing the current to flow in only one direction and restricting flow back to the antenna feed 215.

An advantage of plasma is that its conductivity can be rapidly turned ON and OFF. Consider FIGS. 3A through 3C, which illustrates an example of the plasma chamber of the antenna 203p at three points in time. Each electrode 303 can ionize one section of the gas along the length of the plasma chamber when energized via the plasma ionization control lines 218p. With individual control of each segment of the ionized plasma antenna 203p, different portions of the antenna 203p can be dynamically turned ON and turned OFF.

When a pulse 306 is injected into the plasma via the antenna feed 215 (FIG. 2), it propagates down the plasma gas chamber just as it would along a metal antenna. To allow this, the segment of plasma immediately in front of the pulse is switched ON by energizing the corresponding electrode(s) 303. For example, in FIG. 3A the second electrode 303a is energized (switched ON) by the corresponding plasma ionization control line 218p (FIG. 2) to allow the pulse signal 306 to propagate through that segment of the ionized plasma antenna 203p. Before it reaches the next segment, the third electrode 303b is energized (switched ON) to allow the pulse signal 306 to propagate into that segment as shown in FIG. 3B. Once the pulse 306 has passed that segment of the antenna 203p, it is switched OFF until the next pulse 306 comes along. As shown in FIG. 3C, the second electrode 303a is de-energized (switched OFF) as the pulse signal 306 transitions out of the preceding segment.

The result is that each pulse signal 306 sent down the ionized plasma antenna 203p is effectively escorted by two "bookends" of lower conductivity plasma on either side. The conductivity of the plasma in the bookends should be low enough that current impinging on it from the other direction reflects, but high enough that the electrical charge is not destroyed in the time when the bookend passes through. The current thus proceeds through the ionized plasma antenna 203p in one direction. When each pulse 306 reaches the end of the ionized plasma antenna 203p and is reflected, it encounters a part of the plasma chamber that is turned OFF, which prevents the reflection from propagating back to the antenna feed 215 and therefore deposits its charge near the edge. In this way, the pulse signal 306 cannot return back down the antenna 203p, and the charge builds up at the distal end of the ionized channel. By coordinating the switching of the series of electrodes 303 along the length of the ionized plasma antenna 203p, a series of pulses 306 can travel the length of the antenna 203p without the reflections returning back down the antenna 203p. The current can be flipped around with the negative portion of the feed signal, reducing the charge at the distal end of the ionized channel.

In order to transmit information in this manner, the feed signal can be divided into a series of short pulses as illustrated in FIG. 2. For instance, the sine wave pulse train 212 of FIG. 2 can be generated by dividing the sinusoidal signal up into a series of short pulses, modulated with the envelope of the sine wave. FIG. 4 illustrated the modulation of a communications signal 403, which is divided up into a pulse signal 406 of short Gaussian pulses 306 that can be feed into the ionized plasma antenna 203p. Each of the Gaussian pulses 306 can then be injected into the plasma chamber via the antenna feed 215 (FIG. 2) and propagate down to the end of the antenna 203p, where the reflected pulse is prevented from returning to the feed point.

At first glance, this may appear to be a form of amplitude modulation (AM), which transmits audio signals by encoding it in the amplitude of a higher frequency carrier. But, an AM signal does not actually have a Fourier component at the modulation frequency. On the other hand, the envelope modulation shown in FIGS. 2 and 4 does have a component at the frequency of the envelope. The envelope modulated signal is actually the opposite of AM because the lower frequency is the carrier frequency, and it is being pulsed on and off at a much higher frequency. This can be verified by taking the Fourier transform of the pure communications signal 403 and the same signal split into the pulse signal 406.

Figure 5:
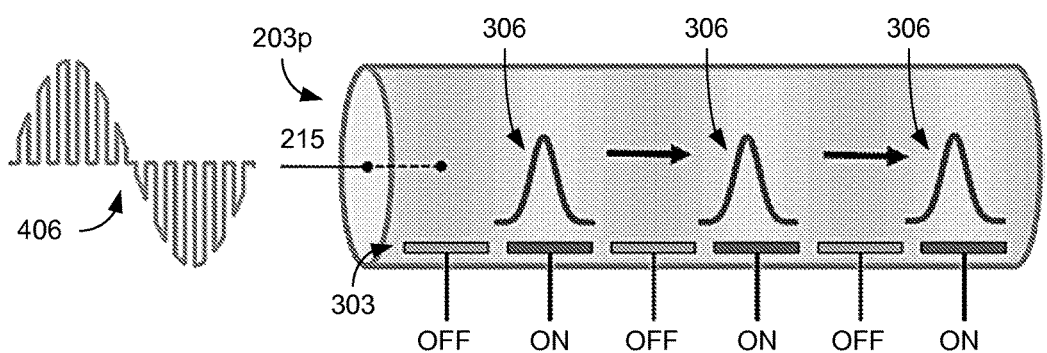
FIG. 5 is a graphical representation illustrating an example of the propagation of multiple pulses through the segmentally time-variant antenna of FIG. 2 in accordance with various embodiments of the present disclosure.

As illustrated in FIG. 5, a series of pulses 306 can be feed into the proximal end of the ionized plasma antenna 203p, and allowed to propagate to the distal end of the antenna 203p by coordinating the ON and OFF switching between the different electrodes 303. Any arbitrary signal can be sent using this signal conversion technique, however some energy is lost by chopping the communication signal 403 (FIG. 4) into the short pulses of the pulse signal 406. This small loss of efficiency can be more than compensated for by the orders of magnitude improvement from blocking the reflected wave.

It has been shown that metal antennas can be replaced with plasma antennas, with operation of plasma antennas having been demonstrated between at frequencies of 100 s of MHz to many GHz. As previously mentioned, dynamically controlled switching of the conductivity of the ionized plasma antenna 203p can, in principle, work at any frequency. In practice, it is limited by the response time of the plasma. The ability to rapidly ionize, and thus modulate the conductivity of the plasma at high speeds, is important to the switching operation of the ionized plasma antenna 203p. In its normal state, a gas is a nearly perfect insulator. However, when a sufficient electric field is applied, the gas can be ionized and become an almost perfect conductor. The transition from insulating to conducting states is known as electrical breakdown. For example, the one-way delay time at the speed of light is 50 ns for a 15 meter long antenna. In order to for the pulse length to be significantly shorter than the antenna length, a pulse period much shorter than 50 ns or smaller is needed. A fast-reacting plasma may be needed to allow transition times that are sufficient for controlling these short pulses.

While an ionized plasma antenna 203p has been presented as an example of a segmentally time-variant antenna 203, this concept may be extended to laser ionization of air to create the channel, rather than laboratory plasma. Rather than electrodes, lasers can be used to ionize segments of air along the length of the antenna 203. The concept may also be achievable with solid state semiconductors, which in many ways resemble a plasma. Segments of a channel of semiconductor material can be controlled by voltages applied through electrodes to reduce the conductivity similar to the ionized plasma antenna 203. One way to construct such a device with semiconductors would be to use a set of transistors in series, each of which is controllable with a gate voltage, which in turn allows electrical current through it when the voltage is high. If the transistors were to be switched on and off in a manner similar to the plasma chamber segments described earlier, then the blocking of the reflected pulse could be achieved. Semiconductor devices with both high speed (able to switch at ns rates or faster) and a high power capacity can be used for such a method. In addition, the voltage drop that typically occurs along the pathway of a transistor turned on may also be an impediment to efficiency. Active time-domain blocking of the reflected wave in an electrically short antenna using any of these materials, can be used to boost efficiency while maintaining high bandwidth.

This concept is also applicable to efficient receiving antennas, using the same principles to efficiently gather the voltages that are induced on an antenna in the presence of an electromagnetic wave being received.

To demonstrate the VAIPER concept theoretically, a one-dimensional finite difference time domain (FDTD) simulation was developed that treats a straight-line antenna as a transmission line. The FDTD model divides the simulation space into small segments, and solves the wave equation step by step in small time increments. To model the segments of the transmission line where the ionization is reduced (antenna OFF), a high resistivity was added to the transmission line which dissipates the propagating current and voltage. The characteristic impedance of the line in the simulation was $Z_0=100\Omega$, and the propagation velocity $v_p$ is the speed of light. The ionized plasma antenna 203$p$ was assumed to be 15 meters long, and terminated with an open circuit.

Figure 6A:
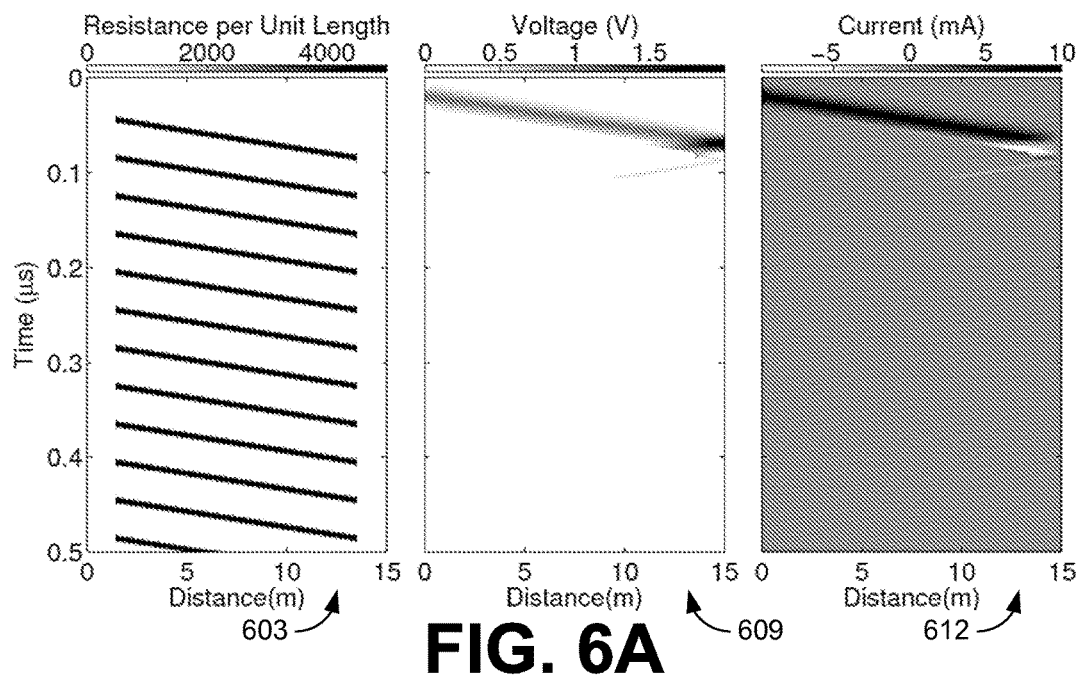
FIGS. 6A and 6B graphically illustrate the propagation of a single pulse and multiple pulses through the segmentally time-variant antenna of FIG. 2 in accordance with various embodiments of the present disclosure.

Referring to FIG. 6A, shown is an example calculation for a single short Gaussian pulse lasting about 25 ns. The left panel 603 illustrates the resistance per unit length with time on the vertical axis and distance on the horizontal (z) axis. The turning off of the plasma in certain locations is demonstrated by the diagonal lines 606 in the panel 603, where the resistance per unit length is high. The location of the "turned off" segments propagate at the speed of light, starting at z=1.5 meters and stopping at z=13.5 meters (the simulated ionized plasma antenna 203$p$ is 15 meters long). The turn-on and turn-off times of the plasma were assumed to be 10 ns.

The center panel 609 and right panel 612 show the corresponding propagation plots for the voltage and current, respectively, of an injected Gaussian pulse 306 with 1 V amplitude and 0.01 A current. Effectively, the pulse 306 was surrounded by two bookends where the resistance was high, but because everything is traveling together at the speed of light, the pulse 306 continues to propagate. When the pulse 306 reaches the end of the ionized plasma antenna 203$p$, it reflects. But the reflected pulse quickly runs into a de-ionized highly resistive segment, where it is attenuated or reflected, so the current does not return to the feed connection.

Figure 6B:
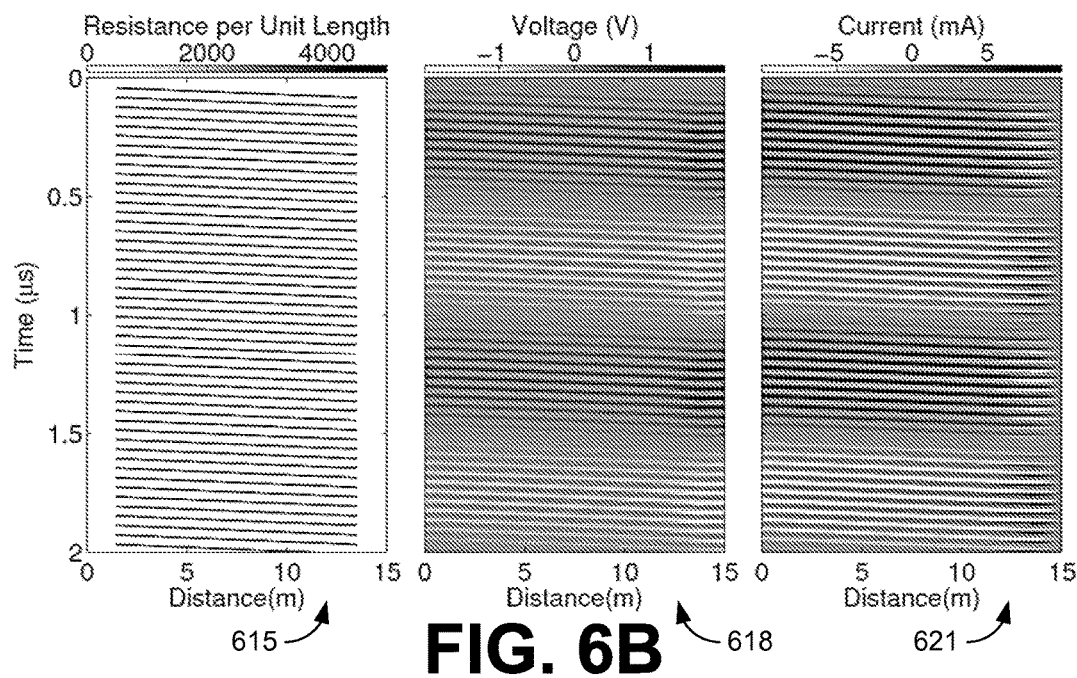

Referring next to FIG. 6B, shown is the same FDTD simulation in FIG. 6A, except that a series of Gaussian pulses 406 (FIG. 5) are injected, each lasting about 25 ns and separated by 40 ns. The left panel 615 is a plot of the resistance per unit length, and the center panel 618 and right panel 621 show the corresponding propagation plots for the voltage and current, respectively. The amplitude of each successive pulse 306 (FIG. 5) is modulated by the envelope of a 1 MHz sine wave, since 1 MHz is the frequency being transmitted. Note that the wavelength at 1 MHz is 300 meters, so the 15 meter antenna is very short compared to the wavelength of the transmission frequency. A simulation lasting 2 µs, or two periods at 1 MHz, is illustrated. Each pulse 306 follows the same trajectory as the single pulse 306 in FIG. 6A, with the series of pulses 406 propagating to the end of the antenna 203$p$, reflecting back from the distal end, hitting a turned-off plasma segment and then depositing its charge. The boundary conditions for the waveguide are still met: close to the edge of the waveguide, there is no current, and voltage is doubled as a result, while a small distance away from the end, the reflections from each pulse 306 have been suppressed.

Although the ionized plasma antenna 203$p$ is not conducting a continuous sine wave at 1 MHz, the modulation of the current and voltage, and the series of pulses 306 with sinusoidally varying amplitudes, has a 1 MHz component because of the envelope at 1 MHz. FIG. 7A shows the voltage and FIG. 7B shows the current at six different points (z=1.9, 3.75, 5.65, 7.5, 9.4, 11.25, 13.15 m) along the antenna 203$p$.

FIG. 8 is a plot illustrating an example of the Fourier component of the current at 1 MHz, calculated at each point along the ionized plasma antenna 203$p$. The amplitude of the Fourier transform at 1 MHz, which is shown as curve 803 in FIG. 8, can be evaluated directly. Note that the current amplitude 803 extends very nearly to the end of the antenna 203$p$, due to the fact that there are no reflections. The current profile starts to drop off rapidly above 12 meters, which is close to where the reflected currents are blocked. There is a slight drop-off in the current magnitude in the middle of the antenna between 1.5 and 12 meters, but this may be attributed to a small amount of attenuation from nonzero resistivity as each pulse propagates toward the distal end of the antenna 203$p$.

The flat current along most of the length of the ionized plasma antenna 203$p$ results from the suppression of the reflected wave. However, there is a drawback, which is that in order to divide the communication signal 403 of FIG. 4 (e.g., the 1 MHz sine wave) into a series of pulses 306, the resulting waveform of the pulse signal 406 (FIG. 4) has less total energy than a clean communication signal 403. For instance, in the simulation, the pulses are 25 ns long, and spaced out by 40 ns, so the duty cycle of the injected pulse train 406 is roughly 50%. However, the advantage of suppressing the reflection far outweighs this loss of energy.

Consider a comparison of the ionized plasma antenna 203$p$ with a conventional metal whip antenna 103 (FIG. 1A) when both are fed by a continuous sinusoidal input voltage. As shown in FIG. 8, the magnitude of the current at each location along the ionized plasma antenna 203$p$ was determined. The conventional whip antenna (without top-hat loading) 103 was also simulated. This is done analytically by simply assuming a reflection coefficient of +1 for the voltage, and −1 for the current, and summing up the input voltage (1 V peak sinusoid) with the reflected current, and therefore directly evaluating equations (3) and (4). The simulation did not include hi-speed switching of the current since it is just a metal antenna. However, the remaining parameters in the analytical simulation used the same assumptions (1 MHz frequency, 15 meter length, $Z_0=100\Omega$).

Curve 806 of FIG. 8 shows the profile of the current for the standard metal whip antenna 103. The familiar linear drop-off of current with distance toward the end of the antenna, classically found in antenna textbooks, was obtained. This linear relationship with distance comes about because of interference between the input and reflected wave from the distal end of the whip antenna 103. The closer a location is to the distal end of the whip antenna 103, the better is the cancellation between the input and reflected current. The actual interference pattern is sinusoidal with a spatial repetition of λ/2 but for short antennas this interference pattern is approximately linear because of the approximation to sin θ~θ.

From equation (2), it can be seen that the current moment (Id) is sufficient to compare two electrically short radiating sources. This quantity can be calculated by integrating the area under the curves in FIG. 8, which yields a value that is almost exactly the same for both the ionized plasma antenna 203p and the whip antenna 103, about 0.23 Amp-meters. Close to the distal end of the antennas, the ionized plasma antenna 203p has higher current due to the suppression of reflection. But close to the feed at the proximal end of the antenna, the whip antenna 103 has higher current since it does not suffer from chopping up the sine wave of the feed signal into small pulses, which cuts away about half of the energy in the VAIPER concept. At 1 MHz, for a 15-meter antenna, these two advantages almost exactly cancel out.

Figure 9A:
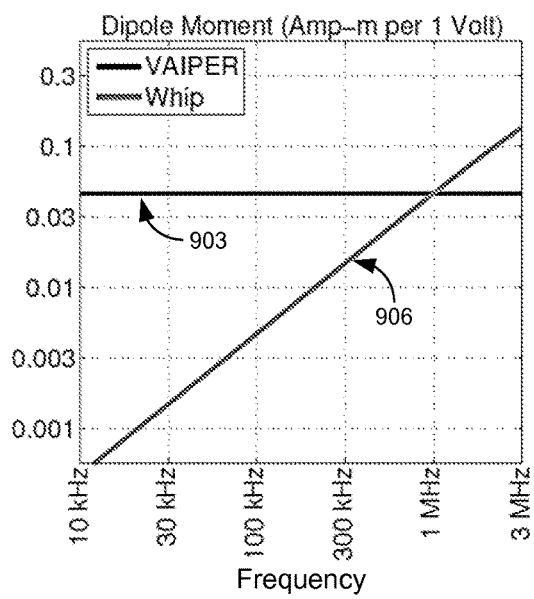
FIGS. 9A and 9B graphically illustrate the dipole moment and radiated power, respectively, for one embodiment of the segmentally time-variant antenna of FIG. 2 in accordance with various embodiments of the present disclosure.

An advantage of the ionized plasma antenna 203p is that as the frequency decreases, and the ionized plasma antenna 203p becomes shorter and shorter compared to the wavelength, the current along the ionized plasma antenna 203p stays roughly constant, whereas for the whip antenna 103, the interference between the outgoing and reflected current reduces the dipole current on the whip antenna 103. To demonstrate this, the simulations were repeated at different frequencies, and the results plotted side by side in FIG. 9A. The dipole moment (curve 903) for the ionized plasma antenna 203p is roughly flat with frequency, whereas for the whip antenna 103, while the dipole moment (curve 906) decreases proportionately with decreasing frequency. At 30 kHz, the ionized plasma antenna 203p produces about 30 times more dipole current magnitude. Note that the dipole moment 903 is proportional to the input frequency, so this plot assumes that 1 Volt has been injected into the ionized plasma antenna 203p.

The magnitude of the radiated magnetic far-field generated from a short monopole antenna is:

$$H_\phi = Id \frac{\sin\theta}{2r\lambda}, \quad (6)$$

where I is the current, d is the length of the antenna, r is the distance to the antenna, λ is the wavelength, and θ is the angle of the observer compared to the current direction. The radiated field is proportional to Id, the total dipole current moment. This provides an easy metric to compare the generation capability of the ionized plasma antenna 203p with a conventional antenna.

Figure 9B:
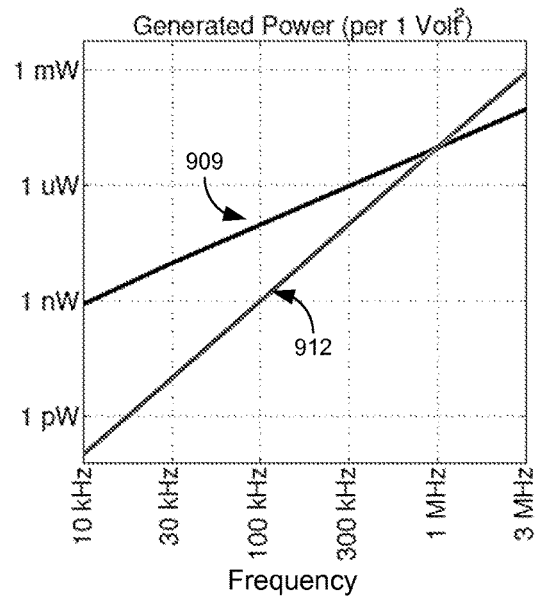

The resulting effect on radiated power is even larger. Equation (2) shows that the radiated power is proportional to the square of the dipole current moment (Id). The radiated power was calculated and plotted for the ionized plasma antenna 203p (curve 909) and the whip antenna 103 (curve 912) in FIG. 9B. At 30 kHz, the ionized plasma antenna 203p produces about 1000 times more power than the whip antenna 103. The radiated power is proportional to the square of the input voltage, but this result was calculated with a 1 Volt input, so if the input voltage was 1000 V, the radiated power would be $10^6$ times higher, or nearly a Watt. This is a remarkable result for a broadband antenna that is only 15 meters long and operating at such a low frequency range.

Of course, the whip antenna 103 used for comparison is not necessarily the best design when it comes to maximizing the radiated power. As described earlier, there is a well-established technique of top-loading (see FIG. 1B), which can suppress the reflected wave, and thus achieve excellent efficiency, by canceling out the high capacitance of the antenna 106 (FIG. 1B). However, top-loading is only effective in a narrow band of frequencies, since the capacitance of the top-hat loaded antenna 106 is a strong function of length, especially for electrically short antennas. In contrast, the ionized plasma antenna 203p is suitable for a wide range of frequencies.

The FDTD simulation was also used to evaluate an ionized plasma antenna 203p having a length of 1 m as a transmission line (100Ω impedance), and compare that to a corresponding whip antenna 103 (FIG. 1A). The transmitted communication signal 403 (FIG. 4) that was chopped into a series of Gaussian pulses 406 (FIG. 4), each lasting about 8 ns and separated by 10 ns. Each pulse 306 (FIG. 5) propagated to the end of the antenna 203p, was reflected at the distal end, hit an OFF segment of the plasma, and deposited its charge. The current was taken as a function of time at each location along the antenna 203p and the Fourier component extracted at the desired frequency, to evaluate the sinusoidal current amplitude along the antenna 203p. A plot of the current amplitude 1003 is shown in FIG. 10A, which is again roughly flat until the close to end of the antenna 203p, because the reflections have been removed.

Figure 10A:
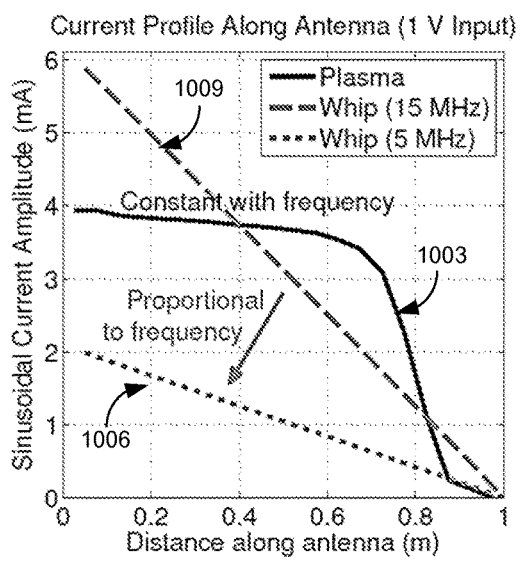
FIGS. 10A and 10B graphically illustrate the current profile and radiated power for another embodiment of the segmentally time-variant antenna of FIG. 2 in accordance with various embodiments of the present disclosure.
Figure 10B:
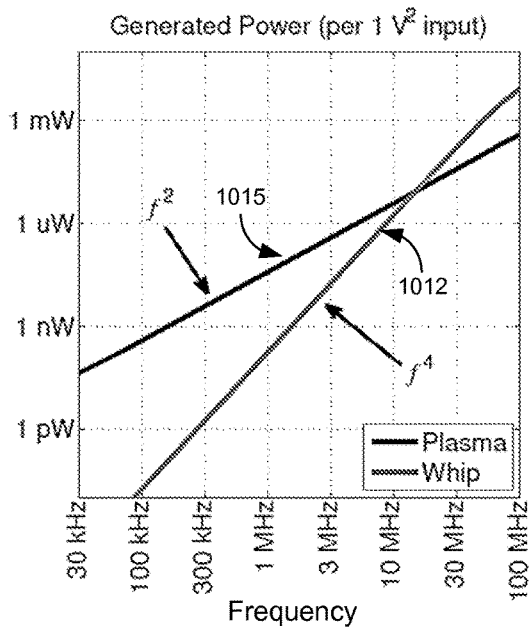

For comparison, a regular whip antenna 103 (FIG. 1A) was also simulated. Curves 1006 and 1009 in FIG. 10A show the results at 5 MHz and 15 MHz frequencies, respectively. As the frequency decreases, and the whip antenna 103 becomes shorter compared to the transmission wavelength, and the interference between the outgoing and reflected currents worsens, therefore there is less net current on the whip antenna 103 and, as a result, the current falls with frequency. The simulations at many different frequencies, plugged the resulting dipole moment (Id) into equation (2), and the radiated power of the plasma antenna (curve 1012) and whip antenna (curve 1015) plotted side by side, as a function of frequency, in FIG. 10B. The radiated power is proportional to the square of the input voltage. At 1.5 MHz, the 1-meter ionized plasma antenna 203p also produces about 100 times more power than a whip antenna, and at 150 kHz, the difference is about 4 orders of magnitude. This is achieved without matching schemes that severely limit the bandwidth.

An example of the implementation of an ionized plasma antenna 203p will now be discussed. Consider a goal of 100 kW of radiated power over a large bandwidth with a 100 m antenna, operating at 20 kHz. This would have comparable power levels to some of the most powerful VLF transmitters currently in operation, but without limitation on bandwidth. Assuming that the antenna is cylindrically shaped and divided into segments that are 10 cm long, the radius, ionization level, and pressure can be calculated to achieve this goal.

The plasma frequency, which defines the slowest pulse that can propagate down the channel of the ionized plasma antenna 203p, is an important parameter used in controlling the operation of the ionized plasma antenna 203p. The plasma can include neutrals, electrons and ions, but because the electrons are so much lighter, their motion dominates most plasma oscillations. The electrons oscillate at the plasma frequency ($\omega_{pe}$), which is given by:

$$\omega_{pe} = \sqrt{\frac{n_e q^2}{\varepsilon_0 m_e}}, \quad (7)$$

where $n_e$ is the electron density, q is the electron charge ($1.6 \times 10^{-19}$ C.), $m_e$ is the electron mass, and $\varepsilon_0$ is the permittivity of free space. The plasma is electrically conducting at frequencies well below this cutoff, since the electrons can rearrange rapidly enough so as to cancel out any AC electric field. In the ionized plasma antenna 203$p$, the pulses are long enough such that the length of the pulse is about 10 cm, or about the length of the segments. Assuming propagation near the speed of light (which is the worst case scenario), this implies that the pulses need to last 0.3 ns or less, so the frequency cutoff needs to be at least 3 GHz. This implies a maximum electron density of at least $10^{18}$ electrons/m$^3$. Note that even assuming an electron density of $10^{19}$ electrons/m$^3$, the plasma frequency for xenon ions at atomic weight 131.2 is about 18.2 MHz, so the ions would be immobile in the 3 GHz range.

Since the pulses can be generated on the order of 1-10 ns long, an electron density of $10^{19}$ electrons/m$^3$ or greater will allow the pulses to propagate efficiently, since the plasma frequency will be 28 GHz, much greater than the 3 GHz required. When the ionization is dropped by three orders of magnitude, to $10^{16}$ electrons/m$^3$, then the plasma frequency is only 900 MHz, in which case a Gaussian pulse 1-10 ns long will not propagate. As such, modulating the electron density between those two values can control the ability of these pulses to propagate through the plasma material.

Using this electron density ($10^{19}$ electrons/m$^3$) as a guideline, the current carrying capacity of the ionized plasma antenna 203$p$ can be calculated to put an upper bound on the total power. The ionized plasma antenna 203$p$ can be designed with the electron density high enough to allow sufficient current propagation through a segment, but low enough that the plasma oscillations do not kill the propagating pulses. The charge and current that the ionized plasma antenna 203$p$ will need to deliver to the distal end can be calculated. The antenna 203$p$ comprises a roughly constant alternating current I over a length d. In classic electromagnetics, this is referred to as an infinitesimal short dipole, or a Hertzian dipole, with current moment Id. The time-averaged radiated power from an infinitesimal dipole above a ground plane is given by equation (2).

Using the P$_{rad}$ formula of equation (2), 100 kW of power with a 100 m antenna utilizes 1.69 kA of current. Since this current is integrated over half of a 20 kHz period, 0.169 Coulomb (C) of charge builds up at the edge of the plasma chamber (noting that the integral of a half sinusoid with amplitude and period 1 is 2). The 0.169 C of charge corresponds to $1.06 \times 10^{18}$ electrons. Assuming very conservatively that only 1% of the available charge is actually carried away by the summation of pulses, the charge needed to be present over the whole chamber is $1.06 \times 10^{20}$ electrons. Taking, conservatively, the minimum electron density calculated earlier of $10^{19}$ electrons/m$^3$, about 10 m$^3$ of volume in the plasma chamber is needed. For a 100 meter long cylindrical antenna, this implies an achievable radius of about 18 cm.

Using xenon gas at a conservatively low pressure of 10 mTorr implies that there are $3 \times 10^{20}$ atoms per m$^3$ at 300 K, and so the chamber has $3 \times 10^{21}$ total atoms for the 10 m$^3$ of volume. Since only $1 \times 10^{20}$ total electrons are needed, the ionization fraction of the xenon gas is small (about 3.3%) and thus achievable. Hence, a practically realizable plasma chamber will have ample current capacity to provide 100 kW of power from a 100 m ionized plasma antenna 203$p$, without utilizing resonant tuning or top-hat loading which restricts the bandwidth, and even with a conservative estimate.

Power capacity can be calculated at any other antenna length, depending on the portability needs. For ionized plasma antennas 203$p$, power capacity is based upon the total available charge in the plasma. For an electron density of $10^{18}$ electrons/m$^3$, a length of 3 meters, and a diameter of 33 cm, there is volume of about 1 m$^3$, therefore $10^{18}$ free electrons are available, or 0.0625 Coulomb (C) of charge. If 10% of this charge is swept up and delivered to the distal end 203$p$, this would correspond to a peak current of 62.5 Amp operating over a sinusoidal period at 20 kHz, which would produce radiation of about 30 W, far above what a 3-meter antenna can ordinarily produce. Although a 3-meter antenna is not as effective as a 100-meter antenna constructed with the same principle, the drop-off in power capacity goes as the square of the length, whereas with an ordinary whip antenna it goes as the fourth power of the length.

High Speed Electronics.

High-speed electronics and/or processing circuitry can be used to implement the segment controller 218 (FIG. 2) to synchronize turning the segments on or off with the propagating pulses. High timing accuracy is important to facilitate propagation of the pulses along the segmentally time-variant antenna 203. For instance, in the ionized plasma antenna 203$p$, a delay of just 0.3 ns between the ionization times of two adjacent segments that are separated by 10 cm is needed, since that is the delay time for 10 cm of propagation.

Figure 11:
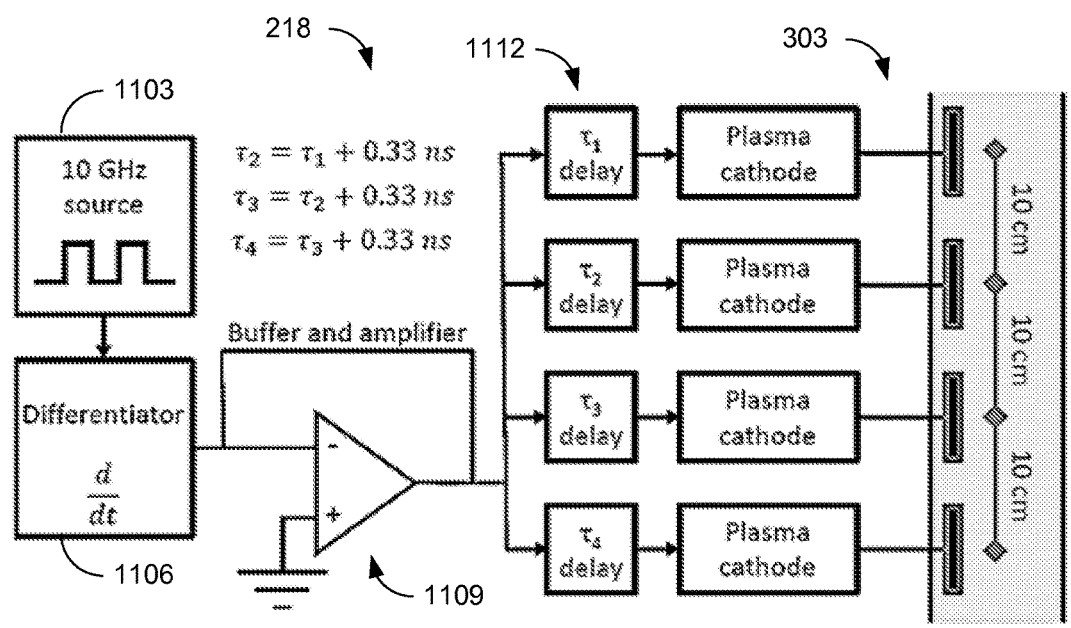
FIG. 11 is a schematic diagram illustrating an example of segment controls for the segmentally time-variant antenna of FIG. 2 in accordance with various embodiments of the present disclosure.

Referring to FIG. 11, shown is a schematic diagram illustrating an example of a segment controller 218 (FIG. 2) for controlling the plasma ionization. For example, the segment controller 218 can include a square wave source 1103 and differentiator 1106 to produce a series of Gaussian pulses. A fast square wave can be produced by, e.g., a square wave generator 1103 operating at a few GHz, and passed through the differentiator 1106 to yield the Gaussian pulses. A gain can be set by the envelope of the frequency that is being transmitted. Off-the-shelf fast pulse generators or application specific circuitry can be used to generate the pulses. The pulse signal is then buffered and amplified by buffer and amplifier circuitry 1109, and then simultaneously distributed to the electrodes 303 which line along the length of the plasma chamber.

The delay times from the output of the buffer and amplifier circuitry 1109 to the various plasma cathodes (electrodes) 303 can be carefully calibrated for synchronization of the plasma ionization. For example, the delay circuit 1112 can include traces that reach consecutive cathodes such that they have slightly different lengths to provide the delay, and thus the same pulse arrives 0.33 ns later to the cathode that is 10 cm further along the plasma channel. Thus, the ionization of each successive segment of the ionized plasma antenna 203$p$ is delayed by the appropriate amount of time to facilitate propagation of the pulses. In some implementations, the delay circuitry can be provided that may be reconfigured for different frequencies and propagation velocities. The design of the segment controller 218 can be a high speed circuit board design that takes into account lengths of traces, reflections at junctions, and tuned lengths of cable to achieve the appropriate delays between electrodes.

It should be noted that some injection of power is needed to maintain the ionization level. For example, the ionization energy for xenon is 12.1 eV, and at a pressure of 10 mTorr, the mean free time for a xenon ion is on the order of 0.1 second before it recombines with an electron. So, the total power to maintain the plasma is about 20 W to provide 12.1 eV per 0.1 seconds for each electron-ion pair, given the total number of carriers in the volume of a 3-meter long ionized plasma antenna 203$p$, which is reasonable.

Segmentally time-variant antenna 203 such as, e.g., ionized plasma antenna 203$p$ can be utilized in a wide variety of applications including, but not limited to, compact HF-UHF antennas, jam-resistant antennas, stealth antennas, non-GPS navigation and timing, subterranean mapping and bunker detection, and submarine communications. HF and UHF transmitting antennas typically have to be long to achieve high bandwidth and efficiency. Segmentally time-variant antennas 203 can allow efficient HF-UHF generation through the whole spectrum, with antennas that are much more compact. Adding bandwidth to transmitting antennas can make fast frequency hopping much more effective, improving performance against active jamming systems. An ionized plasma antenna 203$p$ offers the advantage that it can be turned off when not in use, and will have little or no radar detectability. Even when turned on, it can be designed to be invisible at a radar frequency even while it transmits at a lower frequency. Superior generation and bandwidth at VLF frequencies, which propagate at global distances, can aid in global navigation systems to augment GPS. Generation of Extremely Low Frequency (<3 kHz frequencies) can allow penetration deep into the ground, aiding underground bunker detection from a compact transmitter, more effective than ground penetrating radar. More efficient broadband VLF generators would be far superior to VLF transmitters that are currently used to communicate with submarines.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims. In addition, all optional and preferred features and modifications of the described embodiments and dependent claims are usable in all aspects of the disclosure taught herein. Furthermore, the individual features of the dependent claims, as well as all optional and preferred features and modifications of the described embodiments are combinable and interchangeable with one another.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A system, comprising:
a segmentally time-variant antenna including a plurality of segments between a proximal end and a distal end of the segmentally time-variant antenna; and
a segment controller configured to control conductivity of individual segments of the plurality of segments, wherein the conductivity of the individual segments is modulated by the segment controller to allow a pulse to propagate from the proximal end to the distal end of the segmentally time-variant antenna and impede a reflection of the pulse from the distal end of the segmentally time-variant antenna from propagating back to the proximal end of the segmentally time-variant antenna.

2. The system of claim 1, wherein the segmentally time-variant antenna is an ionized plasma antenna.

3. The system of claim 2, wherein the ionized plasma antenna comprises electrodes corresponding to the individual segments of the plurality of segments, the electrodes energized and de-energized by the segment controller to modulate the conductivity of plasma in the individual segments.

4. The system of claim 3, wherein the electrodes are sequentially energized based at least in part upon a propagation time of the pulse through the segmentally time-variant antenna and spacing between the plurality of segments.

5. The system of claim 1, wherein the pulse is supplied to the segmentally time-variant antenna via a feed connection at the proximal end of the segmentally time-variant antenna.

6. The system of claim 1, wherein the conductivity of the individual segments is modulated by the segment controller to allow a series of pulses to propagate from the proximal end to the distal end of the segmentally time-variant antenna and impede reflections of the series of pulses from the distal end of the segmentally time-variant antenna from propagating back to the proximal end of the segmentally time-variant antenna.

7. The system of claim 6, wherein the series of pulses comprises a series of Gaussian pulses having amplitudes based upon envelope modulation with a communications signal.

8. The system of claim 1, comprising an envelope modulator configured to generate a series of pulses including the pulse, the series of pulses based upon a communication signal.

9. The system of claim 1, wherein the segmentally time-variant antenna comprises:
a solid state semiconductor channel comprising the individual segments; and
a plurality of electrodes disposed on and distributed along the solid state semiconductor channel, wherein the conductivity of the individual segments of the solid state semiconductor channel is modulated by energizing and de-energizing corresponding electrodes of the plurality of electrodes.

10. A system, comprising:
a segmentally time-variant antenna including a plurality of segments between a proximal end and a distal end of the segmentally time-variant antenna, wherein the segmentally time-variant antenna is an ionized plasma antenna comprising:
a plasma chamber extending from the proximal end to the distal end of the ionized plasma antenna; and
a series of electrode pairs positioned along an axial length of the plasma chamber, where individual electrode pairs of the series of electrode pairs are associated with a corresponding segment of the plurality of segments; and a segment controller configured to control conductivity of individual segments of the plurality of segments, wherein the conductivity of the individual segments is modulated by the segment controller to allow a pulse to propagate from the proximal end to the distal end of the segmentally time-variant antenna and impede a reflection of the pulse from the distal end of the segmentally time-variant antenna from propagating back to the proximal end of the segmentally time-variant antenna.

11. The system of claim 10, wherein the segment controller comprises plasma ionization control lines coupled to individual electrode pairs of the series of electrode pairs.

12. A method, comprising:

injecting a pulse at a proximal end of a segmentally time-variant antenna; and modulating conductivity of individual segments of the segmentally time-variant antenna to allow the pulse to propagate from the proximal end to a distal end of the segmentally time-variant antenna and impede a reflection of the pulse from the distal end of the segmentally time-variant antenna from propagating back to the proximal end of the segmentally time-variant antenna.

13. The method of claim 12, comprising:

injecting a series of pulses including the pulse; and modulating the conductivity of the individual segments of the segmentally time-variant antenna to allow the series of pulses to propagate from the proximal end to the distal end and impede reflections of the series of pulses from propagating back to the proximal end of the segmentally time-variant antenna.

14. The method of claim 13, comprising generating the series of pulses based at least in part upon a communication signal.

15. The method of claim 13, wherein the series of pulses are generated by envelope modulating a square wave function with the communication signal.

16. The method of claim 12, wherein a modulation delay between adjacent segments of the segmentally time-variant antenna is based at least in part upon a propagation velocity of the pulse through the segmentally time-variant antenna and spacing between the adjacent segments.

17. The method of claim 12, wherein modulation of the conductivity comprises ionization of plasma of the segmentally time-variant antenna.

18. The method of claim 12, wherein modulation of the conductivity of the individual segments is progressively delayed from the proximal end to the distal end of the segmentally time-variant antenna.

19. The method of claim 18, wherein the delay between adjacent segments is a fixed delay.

* * * * *